(12) United States Patent
Aggarwal et al.

(10) Patent No.: US 7,606,969 B2
(45) Date of Patent: Oct. 20, 2009

(54) PROGRAMMABLE LOGIC DEVICES

(76) Inventors: Davinder Aggarwal, B3A/287 Janak Puri, New Delhi (IN) 110 058; Ashish Kumar Goel, S. 1/8 A-1, Gilat Bazar, Varanasi (IN) 221 002; Namerita Khanna, 228A, DDA-MIG Flat Rajouri Garden, New Delhi (IN) 110 027

( * ) Notice: Subject to any disclaimer, the term of this patent is extended or adjusted under 35 U.S.C. 154(b) by 0 days.

(21) Appl. No.: 11/005,247

(22) Filed: Dec. 6, 2004

(65) Prior Publication Data

US 2005/0172070 A1    Aug. 4, 2005

(30) Foreign Application Priority Data

Dec. 5, 2003    (IN) .................. 1519/DEL/2003

(51) Int. Cl.
    *G06F 13/00*    (2006.01)
(52) U.S. Cl. .................. 711/109; 711/114; 326/39
(58) Field of Classification Search .................. 711/109; 326/39
    See application file for complete search history.

(56) References Cited

U.S. PATENT DOCUMENTS

| | | | | |
|---|---|---|---|---|
| 4,831,573 A | * | 5/1989 | Norman | 708/230 |
| 4,847,812 A | * | 7/1989 | Lodhi | 365/221 |
| 5,206,943 A | * | 4/1993 | Callison et al. | 711/114 |
| 5,787,007 A | | 7/1998 | Bauer | 364/489 |
| 6,429,682 B1 | * | 8/2002 | Schultz et al. | 326/41 |
| 2004/0193798 A1 | * | 9/2004 | Kuwamura | 711/114 |

OTHER PUBLICATIONS

"FPGA-based Fine Grain Processor Array Design Considerations", Proceedings of the Third IEEE International Conference on Electronics, Circuits, and Systems, vol. 2, Oct. 13-16, 1996, pp. 659-662.*

* cited by examiner

*Primary Examiner*—Reginald G Bragdon
*Assistant Examiner*—Larry T Mackall

(57) ABSTRACT

An improved programmable logic device provides increased efficiency and enhanced flexibility in configuration of block memories and includes one or more memory blocks and a vertical shift register that receives the data to be loaded in the memory blocks. The PLD further provides a selection device for selecting the memory cells in the memory blocks that are to store the received data, and a control block for controlling the loading of the data in the memory blocks. The selection device includes an address counter connected to the input of an address decoder so as to enable the selection of addresses in the memory blocks.

22 Claims, 5 Drawing Sheets

PROGRAMMABLE LOGIC DEVICES

BACKGROUND OF THE INVENTION

1. Field of the Invention

The invention relates to improved programmable logic devices. More particularly this invention relates to programmable logic devices that provide more efficient configuration of block memories

2. Description of the Related Art

Programmable logic devices include configuration memory cells, configuration control elements and a matrix of logic blocks, IO blocks and block RAMs. Field programmable gate arrays (FPGAs) are one of the most commonly used programmable logic devices. FIG. 1 shows the block diagram of a typical FPGA. The FPGA includes vertical shift register (VSR) 13 and select register HFF 11 both connected to a control unit 14 and core 12 comprising a plurality of routing lines and an array of memory latches. The control unit 14 has input data, control and status busses to control the operation of the FPGA. To configure the core of the FPGA a data frame is loaded into the VSR 13 and the control unit enables one select line of the select register HFF 11 to shift the column of data from VSR 13 to one column of the core.

FIG. 2 shows the memory latch. A memory latch comprises cross-coupled inverters 22 having transistors 23, 24 connected to them for reading and writing the data. The control terminals of the transistors enable the read or write operation into/from latch.

Block memories are often provided in FPGAs for storing data. FIG. 3 shows an embodiment of the FPGA with block memories 33, 31. The block memories are generally arranged in columns around the array of PLB and routing resources. The figure shows only two columns of the block memory, however there can be more columns of block memories.

FIG. 3 show an FPGA with block memories having a core 32, which is made out of a programmable logic block (PLB) 37 and routing resources 38, 39. The routing resources also interact with the memory. The data in the frames is loaded in the VSR 34, the appropriate line is selected using HFF 36 and the data is transferred from VSR 34 to the corresponding latches. The control unit 35 controls the operation of VSR 34 and HFF 36. The control unit 35 is responsible for accepting the data from the external environment, verifying the data and then loading the data using control signals. Block memories 33 are used as Random Access Memories (RAM) in which the data is loaded during runtime in accordance with the functionality implemented in FPGA. The FPGAs have additional controls (not shown) to control the operation of the block memories as RAMs.

The block memories can also be used as Read Only Memories (ROMs) to augment the configuration memory (or PLB) of the FPGA.

U.S. Pat. No. 5,787,007 describes a scheme for configuring block memories, utilizing the reconfiguration option of the FPGA. In this particular scheme the FPGA is first configured as a RAM loader circuit in which the data is loaded into the RAM, after which it is reconfigured for other desired functions. The control blocks, address counters, and data shift registers for block memory loading are programmed using the block memory. The major disadvantage of this scheme is the requirement of reconfiguration of the system, which results in increased total configuration time. Also the control block of such a system is significantly more complex because it is required to detect the completion of the initial configuration, after which it is required to perform the configuration of the internal memories followed by the reinitialization for the desired logic device.

BRIEF SUMMARY OF THE INVENTION

One embodiment of the invention is directed to a method and device that overcomes the above drawbacks and provides a flexible mechanism of configuration of block memories.

One embodiment of the invention provides an improved programmable logic device providing increased efficiency and enhanced flexibility in configuration of block memories. The PLD includes:
  one or more memory blocks,
  a vertical shift register that receives the data to be loaded in the memory blocks,
  a selection means for selecting the memory cells in the memory blocks that are to store the received data, and
  a control block for controlling the loading of the data in the memory blocks. The selection means includes an address counter connected to the input of an address decoder so as to enable the selection of addresses in the memory blocks.

The counter is reused for general logic functions once the configuration of the block memories has been completed.

Another embodiment of the present invention provides an improved method for configuring block memories in programmable logic device providing increased efficiency and enhanced flexibility. The method includes:
  shifting the configuration data into a vertical shift register,
  selecting the memory locations in which the shifted data is to be stored, and
  providing the control signals for storing the data in the selected locations. The selection of the memory location is performed by generating the desired memory addresses using an address counter.

BRIEF DESCRIPTION OF THE SEVERAL VIEWS OF THE DRAWINGS

The invention will now be described with reference to the accompanying drawings.

DETAILED DESCRIPTION OF THE INVENTION

Figure 1:
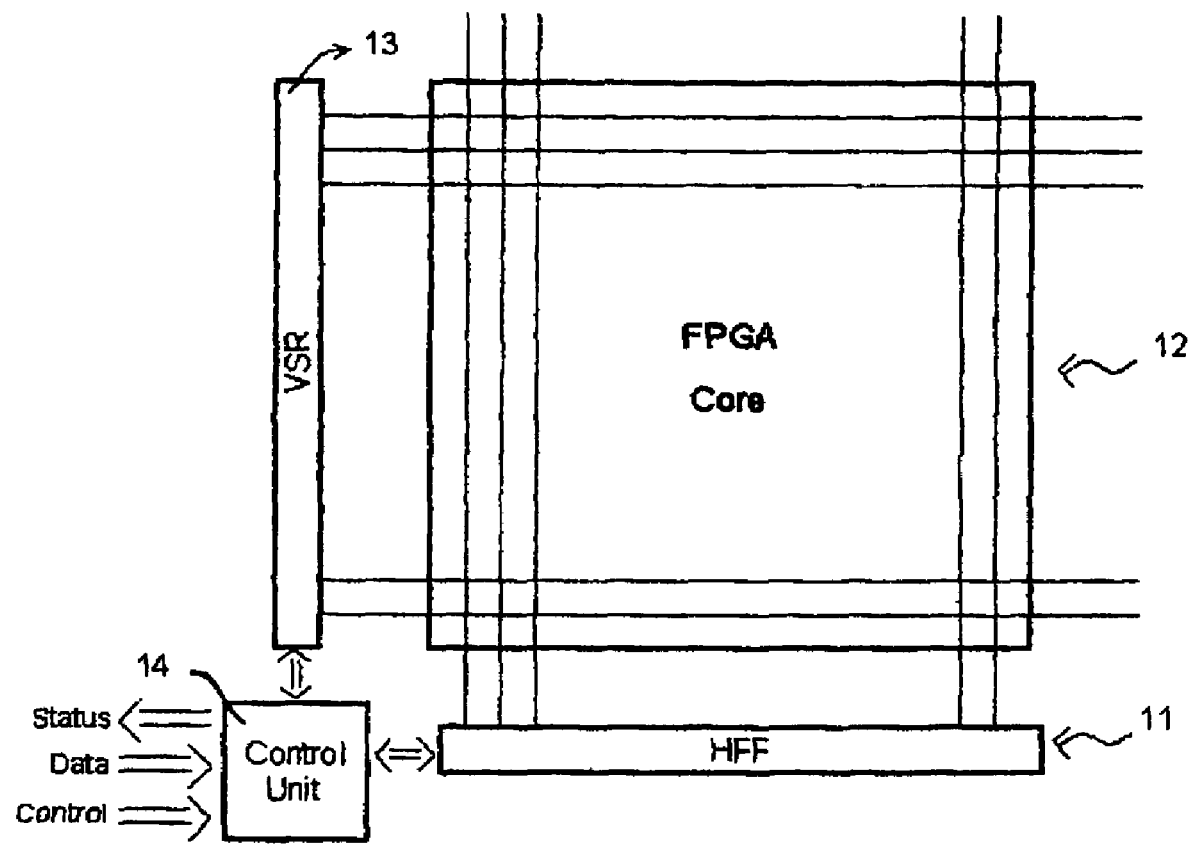
FIG. 1 shows the block diagram of an FPGA.
Figure 2:
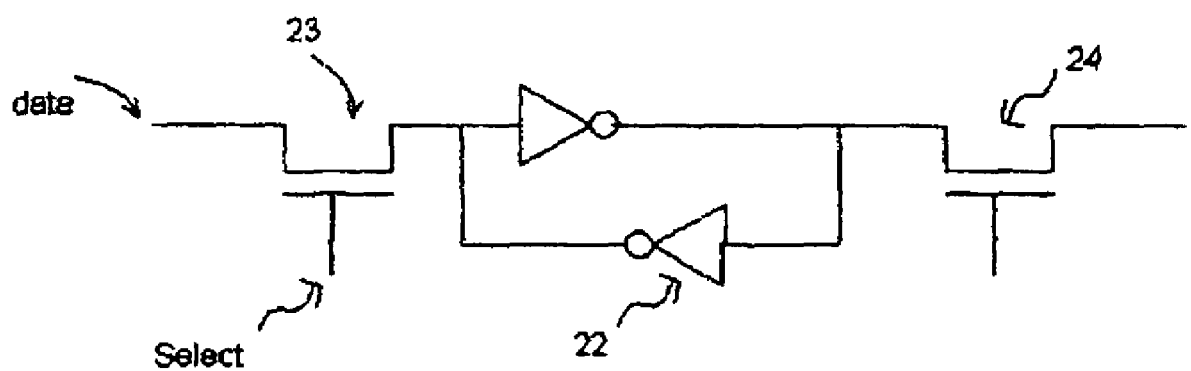
FIG. 2 shows the schematic of a memory latch.
Figure 3:
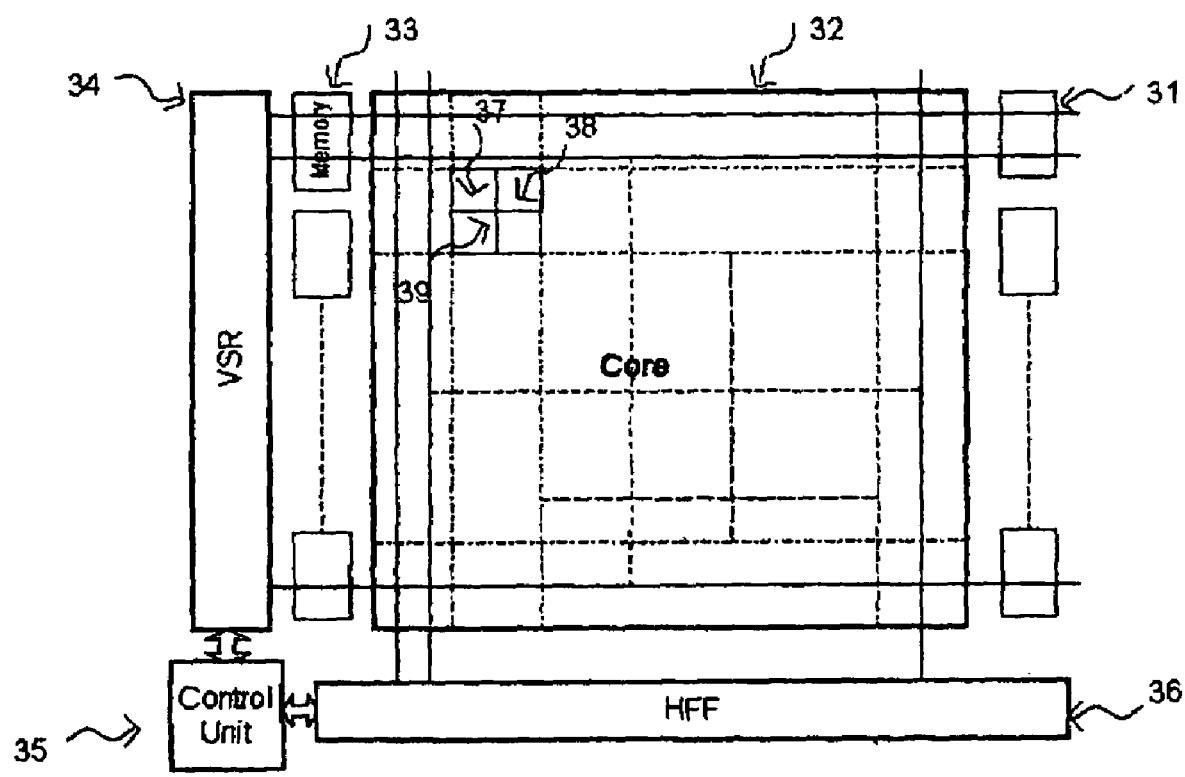
FIG. 3 shows the block diagram of an FPGA with block memories.

FIGS. 1, 2 and 3 have already been described in the background to the invention.

Figure 4:
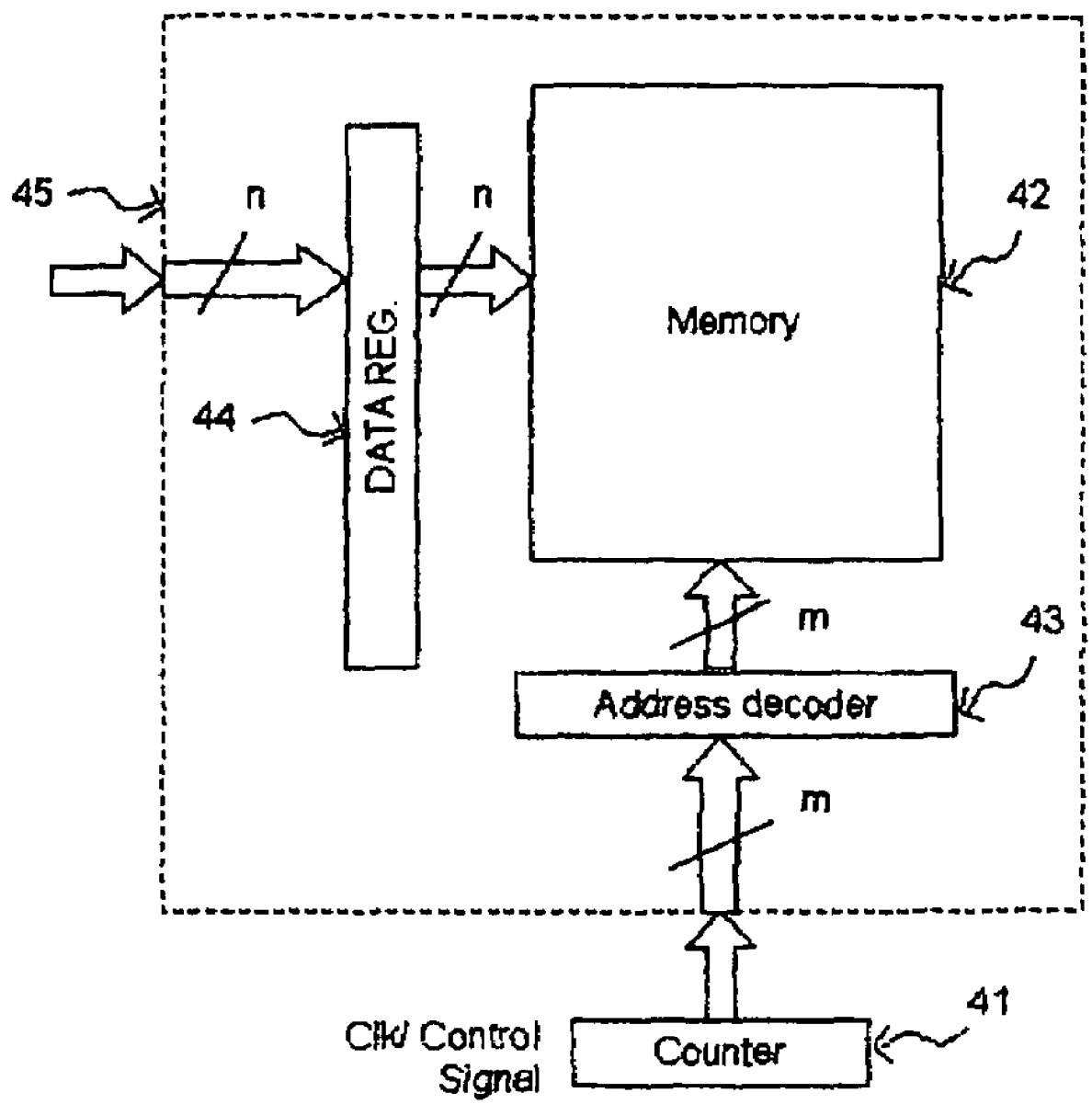
FIG. 4 shows a block memory in accordance with the present invention.

One embodiment of the present invention provides block memory as shown in FIG. 4. A memory block 45 receives inputs from a VSR (not shown in FIG. 4) and an address counter 41. Memory block 45 comprises an array of memory latches 42, receiving a first set of inputs from a data register 44 and a second set of inputs from an address decoder 43. Data register 44 receives inputs from the VSR. The address decoder 43 obtains the input from counter 41 which is controlled by the control unit of the FPGA (not shown in FIG. 4). While the memory organization is configurable in terms of the data and address bus width of the memory array, it is assumed for the purposes of this description that the memory by default is in a mode where the largest width of data bus is selected (n×m). When enabled for configuration the block memory receives data frames from the VSR and a counter value from the address counter 41 is decoded by the address decoder 43 to enable the corresponding column of the block memory for configuration.

Figure 5:
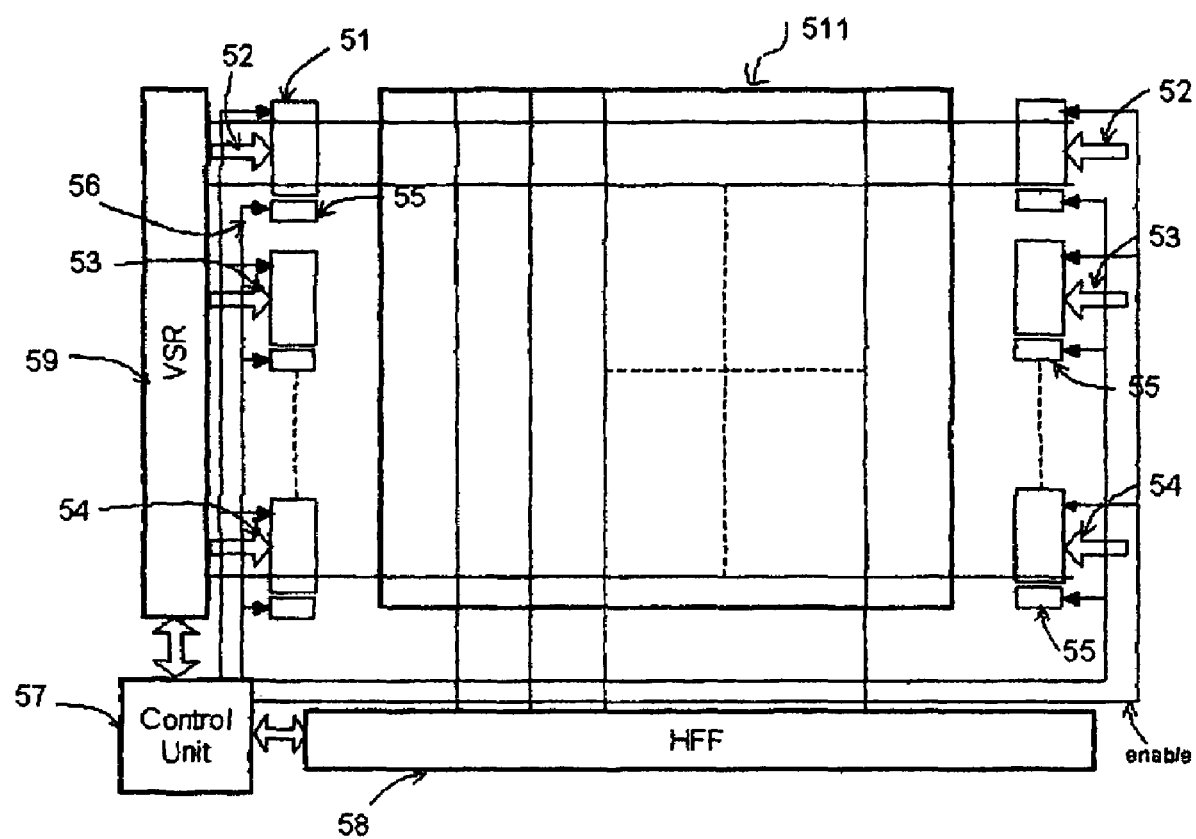
FIG. 5 shows the block diagram of an FPGA with block memories in accordance with the present invention.

FIG. 5 shows the block diagram of an FPGA with block memories 51 in accordance with present invention. Each block memory 51 is configured like the block memory 45 of FIG. 4. Each column of block memories 51 receives inputs 52, 53, 54 from the VSR 59 and an enable signal from control unit 57. A counter 55 (such as the counter 41 of FIG. 4) also receives a control signal 56 from the control unit 57. The FPGA also includes a core 511 (such as the cores 12, 32 of FIGS. 1 and 3) that is connected to a VSR 59 and HFF selection unit 58. The control unit 57 controls the VSR 59 and HFF 58.

The above FPGA can be partially or completely configured by selecting the appropriate mode. In this process first the block memories 51 are chosen to be used as RAM or ROM. If the block memories are to be used as ROM then the block memories are configured along with the rest of the PLBs of the core 511 of the FPGA. Configuration data is loaded in the VSR 59 and a configuration enable signal is given by the HFF selection unit 58, which is a shift register. The enable signal is generated for enabling the configuration of the block memories from the control unit 57 of the FPGA which allows the block memories to receive data from the VSR 59 and starts the counters 55 to provide the address to the address decoder of the block memories. Since the block memories receive dedicated lines from the VSR 59 these memories can be simultaneously configured along with the rest of the PLBs. During the memory configuration, the local memory counter remains selected during the configuration period.

For the case of partial configuration in which only a few memories 51 in a particular column are to be configured, then control bits can be provided to select only those memories which will be configured, rest of memories will remain disabled.

As an additional embodiment of the above invention, the counter used for configuration of the memories 51 can also be used to access the memories in any of the desired modes. After the configuration of memory has been completed, the control of the counter is disabled by the configuration control unit 57, making it available for the user for use as an up/down counter with/without terminal count provision. Typical applications include implementation of LIFO, FIFO functions.

The above description is merely illustrative of the configuration of block memories. A person skilled in the art will appreciate that other circuits could be used to realize the concept of configuration of block memories.

All of the above U.S. patents, U.S. patent application publications, U.S. patent applications, foreign patents, foreign patent applications and non-patent publications referred to in this specification and/or listed in the Application Data Sheet, including but not limited to U.S. Pat. No. 5,787,007 and Indian Patent Application No. 1519/Del/2003 filed on Dec. 5, 2003, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A programmable logic device, comprising:
   a memory core comprising an array of configurable logic and routing blocks;
   at least one embedded memory block coupled to the memory core and a local counter coupled to the embedded memory block;
   a vertical shift register connected to the at least one embedded memory block to receive configuration data to be loaded in the at least one embedded memory block;
   a second shift register connected to the at least one embedded memory block that is configured to:
      store received data, the second shift register adapted to enable a configuration latches column for configuration; and
      enable the local counter to be reused for general logic functions once the configuration of the at least one embedded memory block has been completed using the local counter; and
   a configuration control unit connected to the vertical shift register and the second register for controlling the loading of the data in the at least one embedded memory block, the control unit adapted to start the local counter coupled to the at least one embedded memory.

2. A method comprising:
   configuring a plurality of embedded memory blocks in a programmable logic device, each of the plurality of embedded memory blocks coupled to a field programmable gate array memory core and a respective one of a plurality of address counters, by:
      shifting configuration data into a vertical shift register;
      configuring each of the embedded memory blocks with the respective address counter and data from the vertical shift register to select memory locations in the embedded memory block in which the shifted data is to be stored; and
      providing control signals for storing the data in the selected memory locations and starting the respective address counter; and
   reusing at least one of the plurality of address counters for general counter use after the embedded memory blocks are configured.

3. The method of claim 2, comprising disabling control of one or more of the address counters after the data is loaded in the respective memory block.

4. The method of claim 2, wherein the at least one said address counter is adapted for use as an up/down counter to implement LIFO and FIFO functions.

5. A programmable logic device, comprising:
   a plurality of memory blocks coupled to a field programmable gate array (FPGA) core;
   a vertical shift register (VSR) coupled to the plurality of memory blocks and the FPGA core to provide configuration data to the memory blocks;
   an HFF register coupled to the FPGA core;
   a control unit coupled to the VSR and HFF register for controlling the loading of data in the memory blocks;
   a plurality of address counters, each said address counter coupled to a respective said memory block to provide an address for selecting memory locations in the memory block, each said address counter adapted to be used as an up/down counter for general logic functions after configuration of the respective said memory block; and
   an address decoder connected between each said address counter and each said memory block and structured to enable access to selected memory locations in the memory block.

6. The programmable logic device of claim 5 wherein each said address counter is adapted to be reused for implementation of LIFO and FIFO functions after configuration of the memory block has been completed.

7. The programmable logic device of claim 5, wherein the control unit is structured to control the address counters and enable the memory blocks.

8. A system comprising in a programmable logic device having a field programmable gate array memory core and a plurality of embedded memory blocks coupled to the memory core, comprising:
   means for shifting configuration data into a vertical shift register;
   means for configuring each embedded memory block with an address counter and data from the vertical shift register to select memory locations in each embedded memory block in which the shifted data is to be stored, wherein the address counter is also adapted for use as an up/down counter to implement LIFO or FIFO functions; and
   means for providing control signals for storing the data in the selected memory locations and starting the address counter.

9. The system of claim 8, further comprising means for disabling control of the address counter after the data is loaded in the respective memory block.

10. A method for configuring embedded block memories in a programmable logic device having a field programmable gate array memory core and a plurality of embedded memory blocks coupled to the memory core and a respective local counter coupled to each memory block, comprising:
   shifting configuration data into a vertical shift register;
   selecting memory locations in each said embedded memory block in which the shifted data is to be stored; and
   providing control signals for storing the data in the selected memory locations and starting the local counter; and
   reusing at least one said local counter after the embedded memory blocks are configured.

11. The method of claim 10, wherein the selecting further comprising configuring each embedded memory block with the local counter and data from the vertical shift register.

12. The method of claim 10, wherein each said memory block is associated with a separate address decoder and a separate said address counter.

13. The method of claim 11, wherein a control block is structured to perform the providing through control of the local counter and the memory blocks.

14. The method of claim 11, wherein the local counter is adapted for use as an up/down counter to implement LIFO and FIFO functions.

15. A method comprising:
   configuring a plurality of memory blocks, coupled to a field programmable gate array (FPGA) core, using a plurality of address counters in which each said address counter is coupled to a respective said memory block to provide an address for selecting memory locations in the memory block; and
   reusing at least one said address counter as a general use counter after the plurality of memory blocks are configured.

16. The method of claim 15, wherein the at least one said address counter is adapted as an up/down counter.

17. The method of claim 15, wherein the at least one said address counter is adapted to implement LIFO functions.

18. The method of claim 15, wherein the at least one said address counter is adapted to implement FIFO functions.

19. A programmable logic device comprising:
   a field programmable gate array memory core;
   a plurality of memory blocks coupled to the memory core; and
   a plurality of address counters, each of which being coupled to a respective one of the plurality of address counters to provide an address for selecting memory locations in the memory block to configure the plurality of memory blocks and at least one of the address counters being configured for use as a general use counter after the plurality of memory blocks are configured.

20. The programmable logic device of claim 19, wherein the at least one of the plurality of address counters is adapted as an up/down counter.

21. The programmable logic device of claim 19, wherein the at least one of the plurality of address counters is adapted to implement LIFO functions.

22. The programmable logic device of claim 19, wherein the at least one of the plurality of address counters is adapted to implement FIFO functions.

* * * * *

UNITED STATES PATENT AND TRADEMARK OFFICE
CERTIFICATE OF CORRECTION

PATENT NO. : 7,606,969 B2  
APPLICATION NO. : 11/005247  
DATED : October 20, 2009  
INVENTOR(S) : Aggarwal et al.

Page 1 of 1

It is certified that error appears in the above-identified patent and that said Letters Patent is hereby corrected as shown below:

Column 1, line 2, add the following heading and paragraph before the heading "BACKGROUND OF THE INVENTION":

CROSS-REFERENCE TO RELATED APPLICATIONS

The present application claims priority to Indian Patent Application No. 1519/Del/2003, filed December 5, 2003.

Claim 19:  
Column 6, lines 28-29, replace "address counters" with --memory blocks--.

Signed and Sealed this  
Twenty-seventh Day of March, 2012

David J. Kappos  
*Director of the United States Patent and Trademark Office*